US010873316B2

(12) United States Patent
Lee et al.

(10) Patent No.: US 10,873,316 B2
(45) Date of Patent: Dec. 22, 2020

(54) ACOUSTIC RESONATOR AND METHOD OF MANUFACTURING THE SAME

(71) Applicant: Samsung Electro-Mechanics Co., Ltd., Suwon-si (KR)

(72) Inventors: Tae Kyung Lee, Suwon-si (KR); Won Han, Suwon-si (KR); Tae Yoon Kim, Suwon-si (KR); Jong Woon Kim, Suwon-si (KR); Moon Chul Lee, Suwon-si (KR); Chang Hyun Lim, Suwon-si (KR); Sang Kee Yoon, Suwon-si (KR); Hwa Sun Lee, Suwon-si (KR); Dae Hun Jeong, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 376 days.

(21) Appl. No.: 15/797,265

(22) Filed: Oct. 30, 2017

(65) Prior Publication Data

US 2018/0254764 A1  Sep. 6, 2018

(30) Foreign Application Priority Data

Mar. 2, 2017 (KR) .................. 10-2017-0027271
Jun. 1, 2017 (KR) .................. 10-2017-0068648

(51) Int. Cl.
*H03H 9/17* (2006.01)
*H03H 9/05* (2006.01)
(Continued)

(52) U.S. Cl.
CPC .............. *H03H 9/174* (2013.01); *H03H 3/02* (2013.01); *H03H 9/02118* (2013.01);
(Continued)

(58) Field of Classification Search
CPC combination set(s) only.
See application file for complete search history.

(56) References Cited

U.S. PATENT DOCUMENTS 6,396,200 B2  5/2002  Misu et al.
6,476,536 B1  11/2002  Pensala
(Continued)

FOREIGN PATENT DOCUMENTS

JP       5319491 B2    10/2013
JP    2016-225746 A    12/2016
(Continued)

OTHER PUBLICATIONS

English Translation of KR 1020040102390 (Year: 2004).*
(Continued)

*Primary Examiner* — Bryan P Gordon
(74) *Attorney, Agent, or Firm* — NSIP Law

(57) ABSTRACT

An acoustic resonator includes: a central portion; an extension portion extended outwardly of the central portion; a first electrode, a piezoelectric layer, and a second electrode sequentially stacked on a substrate, in the central portion; and an insertion layer disposed below the piezoelectric layer in the extension portion, wherein the piezoelectric layer includes a piezoelectric portion disposed in the central portion, and a bent portion disposed in the extension portion and extended from the piezoelectric portion at an incline depending on a shape of the insertion layer.

22 Claims, 10 Drawing Sheets

(51) Int. Cl.
*H03H 3/02* (2006.01)
*H03H 9/02* (2006.01)
*H03H 9/54* (2006.01)

(52) U.S. Cl.
CPC .......... *H03H 9/0504* (2013.01); *H03H 9/173* (2013.01); *H03H 9/547* (2013.01); *H03H 2003/021* (2013.01); *H03H 2003/023* (2013.01)

(56) References Cited

U.S. PATENT DOCUMENTS

| | | | |
|---|---|---|---|
| 6,788,170 B1 | 9/2004 | Kaitila et al. | |
| 6,812,619 B1 | 11/2004 | Kaitila et al. | |
| 6,842,089 B2 | 1/2005 | Lee | |
| 7,280,007 B2 | 10/2007 | Feng et al. | |
| 7,388,454 B2 | 6/2008 | Ruby et al. | |
| 7,714,684 B2 | 5/2010 | Ruby et al. | |
| 8,330,325 B1 | 12/2012 | Burak et al. | |
| 9,401,692 B2 | 7/2016 | Burak et al. | |
| 9,490,418 B2 | 11/2016 | Burak et al. | |
| 2005/0237132 A1* | 10/2005 | Sano | H03H 3/02 333/189 |
| 2010/0148636 A1* | 6/2010 | Nishihara | H03H 9/02015 310/365 |
| 2011/0084779 A1* | 4/2011 | Zhang | H03H 9/584 333/187 |
| 2011/0101392 A1* | 5/2011 | Park | H01L 33/486 257/98 |
| 2012/0200199 A1 | 8/2012 | Taniguchi et al. | |
| 2014/0118087 A1 | 5/2014 | Burak et al. | |
| 2015/0207490 A1* | 7/2015 | Taniguchi | H03H 9/568 333/133 |
| 2016/0191015 A1 | 6/2016 | Ivira et al. | |
| 2016/0353221 A1 | 12/2016 | Okamura et al. | |
| 2017/0207768 A1* | 7/2017 | Liu | H03H 9/02015 |
| 2017/0237409 A1* | 8/2017 | Han | H01L 41/047 310/348 |

FOREIGN PATENT DOCUMENTS

| | | |
|---|---|---|
| KR | 10-2004-0102390 A | 12/2004 |
| KR | 10-2011-0048338 A | 5/2011 |
| KR | 10-1352177 B1 | 1/2014 |
| WO | WO 2009/132011 A2 | 10/2009 |

OTHER PUBLICATIONS

Korean Office Action dated Sep. 28, 2018, in corresponding Korean Application No. 10-2017-0068648 (13 pages in English, 9 pages in Korean).

Korean Office Action dated Feb. 22, 2018 in corresponding Korean Patent Application No. 10-2017-00686458 (7 pages in English, 6 pages in Korean).

* cited by examiner

ACOUSTIC RESONATOR AND METHOD OF MANUFACTURING THE SAME

CROSS-REFERENCE TO RELATED APPLICATIONS

This application claims the benefit under 35 U.S.C. §119 (a) of Korean Patent Application Nos. 10-2017-0027271 and 10-2017-0068648 filed on Mar. 2, 2017 and Jun. 1, 2017, respectively, in the Korean Intellectual Property Office, the entire disclosures of which are incorporated herein by reference for all purposes.

BACKGROUND

1. Field

The following description relates to an acoustic resonator and a method of manufacturing an acoustic resonator.

2. Description of Related Art

In accordance with the trend for the miniaturization of wireless communications devices, the miniaturization of high frequency component technology has been actively demanded. For example, a bulk acoustic wave (BAW) resonator type filter using semiconductor thin film wafer manufacturing technology may be provided in a wireless communications device.

A bulk acoustic wave (BAW) resonator is a thin film type element that generates resonance using piezoelectric characteristics of a piezoelectric dielectric material deposited on a silicon wafer, which is configured as a semiconductor substrate. The BAW resonator is implemented as a filter.

The BAW resonator may be used in devices such as a small, light filter, an oscillator, a resonant element, or an acoustic resonant mass sensor of a mobile communications device or a chemical and biological device.

Research into several structural shapes and functions for improving characteristics and performance of the BAW resonator has been conducted. Additionally, research into a method of manufacturing a bulk acoustic wave resonator has also been continuously conducted.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes: a central portion; an extension portion extended outwardly of the central portion; a first electrode, a piezoelectric layer, and a second electrode sequentially stacked on a substrate, in the central portion; and an insertion layer disposed below the piezoelectric layer in the extension portion, wherein the piezoelectric layer includes a piezoelectric portion disposed in the central portion, and a bent portion disposed in the extension portion and extended from the piezoelectric portion at an incline depending on a shape of the insertion layer.

The insertion layer may include an inclined surface so that the insertion layer has a thickness that increases as a distance from the central portion increases. The bent portion may include an inclined portion disposed on the inclined surface of the insertion layer.

A portion of the insertion layer may be disposed below the first electrode or between the first electrode and the piezoelectric layer.

A portion of the second electrode may be disposed in the extension portion.

The portion of second electrode disposed in the extension portion may be formed on an inclined surface of the inclined portion, and may include an area that is smaller than an area of the inclined surface of the inclined portion.

The portion of the second electrode disposed in the extension portion may be formed over an entirety of an inclined surface of the inclined portion.

The bent portion of the piezoelectric layer may include an extended portion extended outwardly from the inclined portion. The second electrode may be disposed on the inclined portion and the extended portion.

The acoustic resonator may further include a cavity disposed between the substrate and the central portion.

The acoustic resonator may further include an etching preventing portion disposed along a boundary of the cavity and defining a horizontal area of the cavity.

The second electrode may include a trench formed along a boundary of the central portion.

The acoustic resonator may further include: a protecting layer disposed on the second electrode, wherein the protecting layer includes a trench formed along a boundary of the central portion.

The insertion layer may be formed of a material that is different from a material of the piezoelectric layer.

The insertion layer may be formed of a dielectric material.

In another general aspect, a method to manufacture an acoustic resonator includes: forming a first electrode on a substrate; forming a piezoelectric layer including a piezoelectric portion stacked on the first electrode and a bent portion extended at an incline from a boundary of the piezoelectric portion; and forming a second electrode on the piezoelectric layer.

The method may further include: forming an insertion layer below the bent portion, prior to the forming of the piezoelectric layer, wherein the bent portion includes an inclined surface having a configuration depending on a shape of the insertion layer.

The forming of the second electrode on the piezoelectric layer may include forming the second electrode over an entirety of an upper surface of the piezoelectric portion and on a portion of the inclined surface of the bent portion.

In another general aspect, an acoustic resonator includes: a central portion; an extension portion extended outwardly of the central portion; a first electrode, a piezoelectric layer, and a second electrode sequentially stacked on a substrate, in the central portion; and an insertion layer disposed below the piezoelectric layer in the extension portion, wherein a portion of the piezoelectric layer disposed in the extension portion comprises an inclined portion caused by the insertion layer.

The inclined portion may be disposed on an inclined surface of the insertion layer.

The inclined portion and the inclined surface may be inclined at a same angle.

The inclined surface may be inclined at an angle of 5° to 70°.

The central portion and the extension portion may be disposed in a resonant part of the acoustic resonator.

In another general aspect, a method to manufacture an acoustic resonator includes: forming a first electrode on a substrate; forming an insertion layer on the first electrode; forming a piezoelectric layer on the first electrode and the insertion layer so that an outer circumferential portion of the piezoelectric layer in a resonant part of the acoustic resonator is inclined with respect to a central portion of the piezoelectric layer in the resonant part; and forming a second electrode on the piezoelectric layer.

The outer circumferential portion of the piezoelectric layer may be disposed on an inclined surface of the insertion layer.

The inclined surface may be inclined at an angle of 5° to 70°.

The outer circumferential portion may be inclined at the angle of 5° to 70°.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
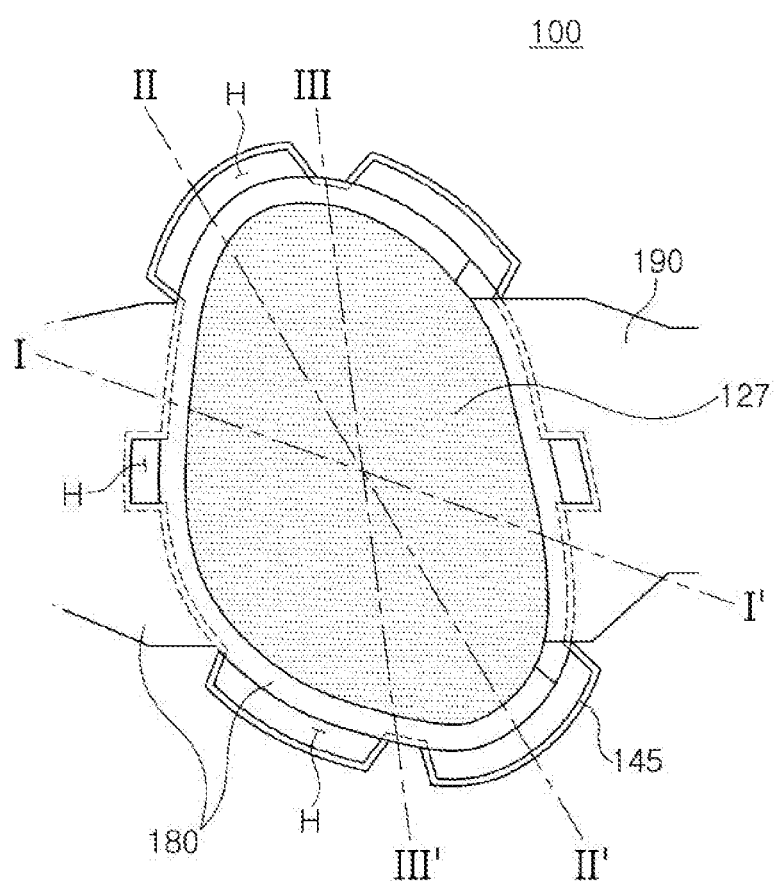
FIG. 1 is a plan view of an acoustic resonator, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments will be described in detail with reference to the accompanying drawings.

Figure 2:
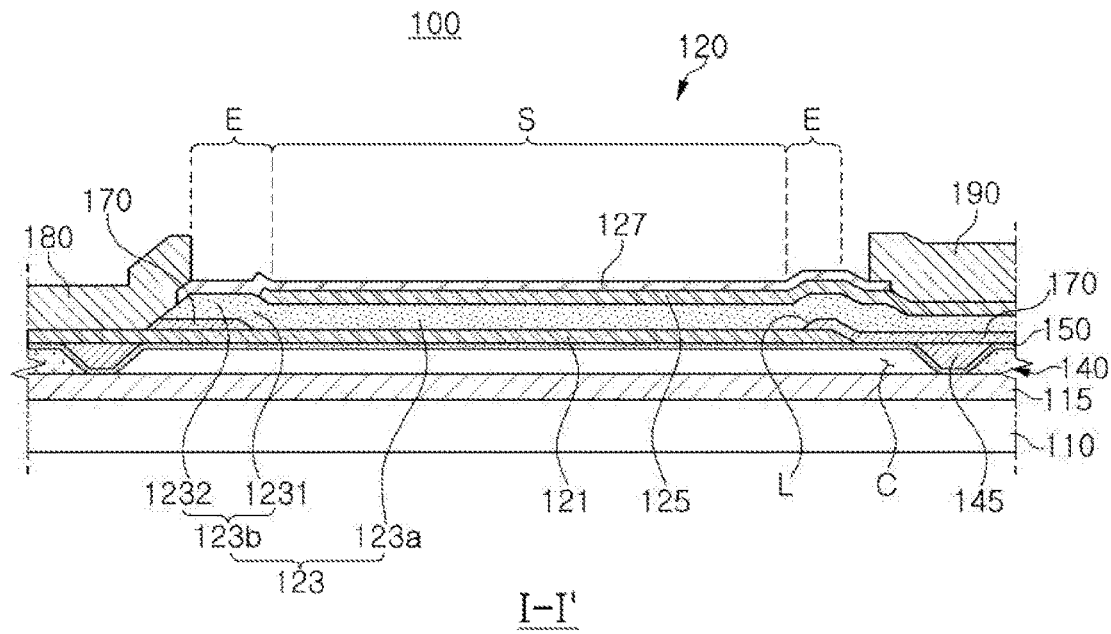
FIG. 2 is a cross-sectional view taken along line I-I' of FIG. 1.
Figure 3:
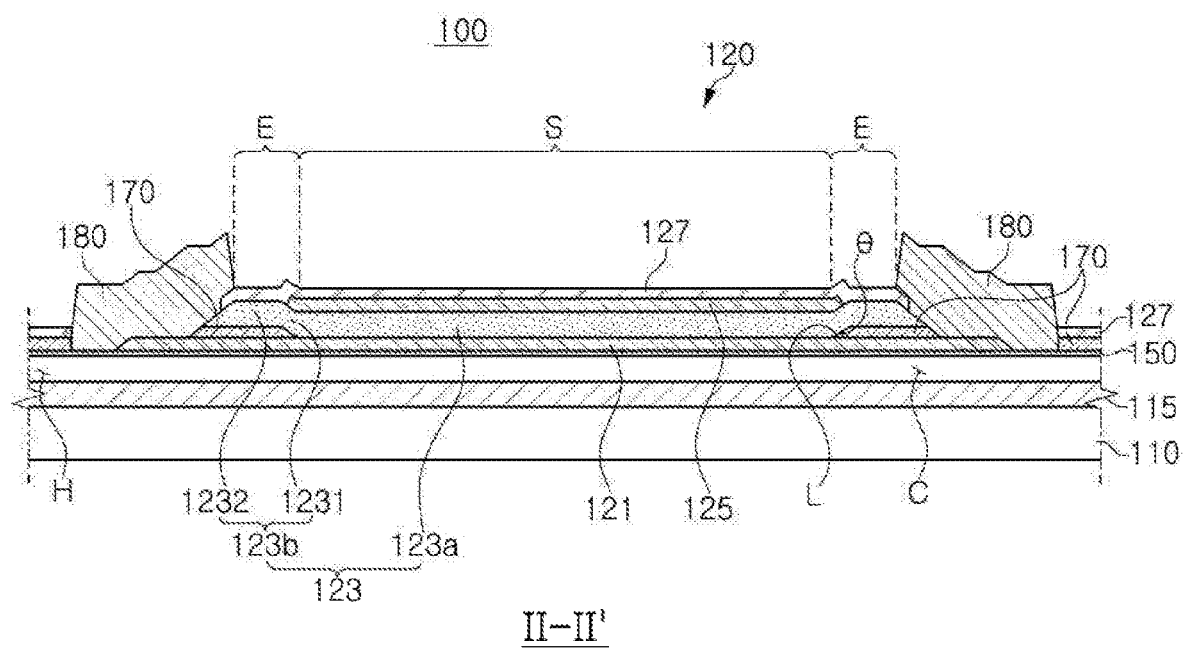
FIG. 3 is a cross-sectional view taken along line II-II' of FIG. 1.
Figure 4:
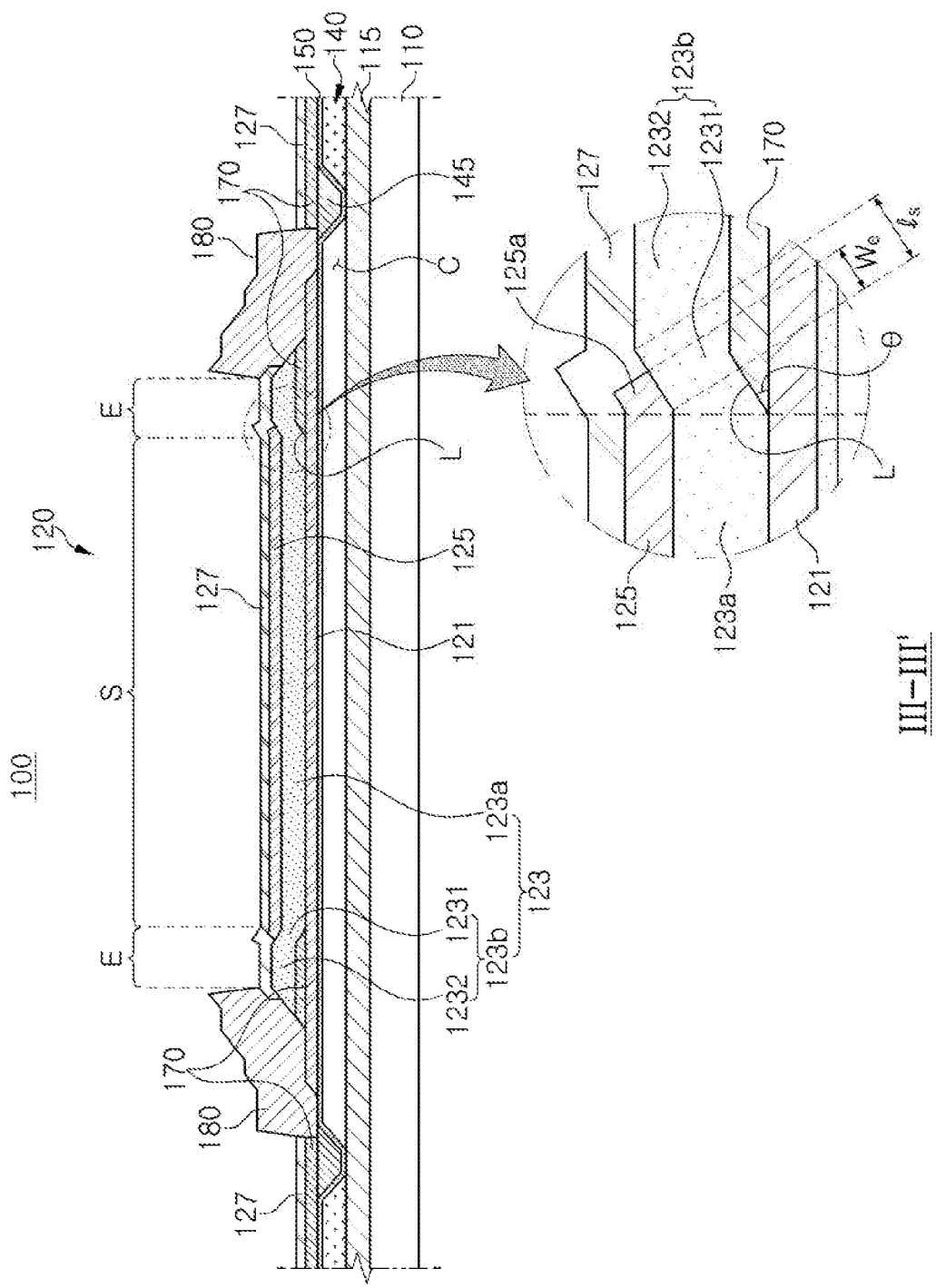
FIG. 4 is a cross-sectional view taken along line III-III' of FIG. 1.

FIG. 1 is a plan view of an acoustic resonator 100 according to an embodiment. FIG. 2 is a cross-sectional view taken along line I-I' of FIG. 1. In addition, FIG. 3 is a cross-sectional view taken along line II-II' of FIG. 1, and FIG. 4 is a cross-sectional view taken along line III-III' of FIG. 1.

Referring to FIGS. 1 through 4, the acoustic resonator 100 is a bulk acoustic wave resonator (BAW), and includes a substrate 110, a sacrificial layer 140, a resonant part 120, and an insertion layer 170.

The substrate 110 may be a silicon substrate. For example, the substrate 110 is a silicon wafer or a silicon on insulator (SOI) type substrate.

An insulating layer 115 is disposed on an upper surface of the substrate 110 to electrically isolate the substrate 110 and the resonant part 120 from each other. In addition, the insulating layer 115 prevents the substrate 110 from being etched by an etching gas at the time of forming a cavity C in a process of manufacturing the acoustic resonator 100.

In this case, the insulating layer 115 may be formed of any one or any combination of any two or more of a silicon dioxide ($SiO_2$), a silicon nitride ($Si_3N_4$), an aluminum oxide ($Al_2O_3$), and an aluminum nitride (AlN), and may be formed on the substrate 110 by any one of a chemical vapor deposition process, a radio frequency (RF) magnetron sputtering process, and an evaporation process.

The sacrificial layer 140 is formed on the insulating layer 115, and the cavity C and an etching preventing portion 145 are formed in the sacrificial layer 140.

The cavity C is an empty space, and may be formed by removing a portion of the sacrificial layer 140.

Since the cavity C is formed in the sacrificial layer 140, the resonant part 120 formed on the sacrificial layer 140 may be entirely flat.

The etching preventing portion 145 is disposed along a boundary of the cavity C. The etching preventing portion 145 may be provided in order to prevent etching from being performed beyond a cavity region in a process of forming the cavity C. Therefore, a horizontal area of the cavity C is defined by the etching preventing portion 145, and a vertical area of the cavity C is defined by a thickness of the sacrificial layer 140.

A membrane layer 150 is formed on the sacrificial layer 140 to define a thickness (or a height) of the cavity C together with the substrate 110. Therefore, the membrane layer 150 is formed of a material that is not easily removed in the process of forming the cavity C.

For example, when a halide based etching gas such as fluorine (F) or chlorine (Cl) is used to remove a portion (for example, the cavity region) of the sacrificial layer 140, the membrane layer 150 is formed of a material of which reactivity to the abovementioned etching gas is low. In this case, the membrane layer 150 may include either one or both of a silicon dioxide ($SiO_2$) and a silicon nitride ($Si_3N_4$).

In addition, the membrane layer 150 may be a dielectric layer containing any one or any combination of any two or more of a magnesium oxide (MgO), a zirconium oxide ($ZrO_2$), an aluminum nitride (AlN), a lead zirconate titanate (PZT), a gallium arsenide (GaAs), a hafnium oxide ($HfO_2$), an aluminum oxide ($Al_2O_3$), a titanium oxide ($TiO_2$), and a zinc oxide (ZnO), or may be a metal layer containing at any one or any combination of any two or more of aluminum (Al), nickel (Ni), chromium (Cr), platinum (Pt), gallium (Ga), and hafnium (Hf). However, the membrane layer 150 is not limited to the foregoing examples.

A seed layer (not illustrated) formed of an aluminum nitride (AlN) may be formed on the membrane layer 150. For example, the seed layer is disposed between the membrane layer 150 and a first electrode 121. The seed layer is formed using a dielectric material or a metal having a hexagonal close packed (HCP) structure, in addition to AlN. When the seed layer is formed of the metal, the seed layer is formed of titanium (Ti), for example.

The resonant part 120 includes the first electrode 121, a piezoelectric layer 123, and a second electrode 125. The first electrode 121, the piezoelectric layer 123, and the second electrode 125 are sequentially stacked from a lower portion of the resonant part 120. Therefore, in the resonant part 120, the piezoelectric layer 123 is disposed between the first electrode 121 and the second electrode 125.

Since the resonant part 120 is formed on the membrane layer 150, the membrane layer 150, the first electrode 121, the piezoelectric layer 123, and the second electrode 125 are sequentially stacked on the substrate 110 to form the resonant part 120.

The resonant part 120 may resonate the piezoelectric layer 123 in response to signals applied to the first electrode 121 and the second electrode 125 to generate a resonant frequency and a anti-resonant frequency.

The resonant part 120 includes a central portion S in which the first electrode 121, the piezoelectric layer 123, and the second electrode 125 are approximately flatly stacked and an extension portion E in which the insertion layer 170 is interposed between the first electrode 121 and the piezoelectric layer 123.

The central portion S is a region disposed at the center of the resonant part 120, and the extension portion E is a region disposed along a circumference of the central portion S. Therefore, the extension portion E is a region extended outwardly from the central portion S.

The insertion layer 170 has an inclined surface L so that the insertion layer 170 has a thickness that increases as a distance from the central portion S increases.

In the extension portion E, the piezoelectric layer 123 and the second electrode 125 are disposed on the insertion layer 170. Therefore, portions of the piezoelectric layer 123 and the second electrode 125 positioned in the extension portion E have inclined surfaces depending on/caused by a shape of the insertion layer 170.

In the embodiment of FIGS. 1 to 4, the extension portion E is included in the resonant part 120, and thus, resonance may also be generated in the extension portion E. However, a positions at which the resonance is generated are not limited to the described example. That is, the resonance may not be generated in the extension portion E depending on a structure of the extension portion E, and may be generated in only the central portion S.

The first electrode 121 and the second electrode 125 are formed of an electrically conductive material, for example, any one or any combination of any two or more of gold, molybdenum, ruthenium, iridium, aluminum, platinum, titanium, tungsten, palladium, tantalum, chromium, and nickel. However, the first and second electrodes 121 and 125 are not limited to being formed of the listed materials.

The first electrode 121 may have an area that is greater than an area of the second electrode 125, and a first metal layer 180 is disposed along an outer side of the first electrode 121 on the first electrode 121. Therefore, the first metal layer 180 surrounds the second electrode 125.

The first electrode 121 is disposed on the membrane layer 150, and therefore may be entirely flat. On the other hand, the second electrode 125 is disposed on the piezoelectric layer 123, and may therefore have a bend corresponding to a shape of the piezoelectric layer 123.

The second electrode 125 is disposed throughout an entirety of the central portion S, and is partially disposed in the extension portion E. Therefore, the second electrode 125 includes a portion disposed on a piezoelectric portion 123a of the piezoelectric layer 123, to be described below, and a portion disposed on a bent portion 123b of the piezoelectric layer 123.

In more detail, as shown in FIGS. 2 to 4, the second electrode 125 is disposed to cover the entirety of the piezoelectric portion 123 and a portion of an inclined portion 1231 of the piezoelectric layer 123. Therefore, as shown in FIG. 4, a portion 125a of the second electrode 125 that is disposed in the extension portion E has an area that smaller than an area of an inclined surface of the inclined portion 1231, and the second electrode 125 has an area in the resonant part 120 that is smaller than an area of the piezoelectric layer 123 in the resonant part 120.

Referring to FIGS. 2 to 4, the piezoelectric layer 123 is formed on the first electrode 121 and the insertion layer 170 to be described below.

A zinc oxide (ZnO), an aluminum nitride (AlN), a doped aluminum nitride, a lead zirconate titanate, or quartz, or the like, may be used as a material of the piezoelectric layer 123. The doped aluminum nitride may further include a rare earth metal or a transition metal. As an example, the rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), niobium (Nb), and magnesium (Mg).

The piezoelectric layer 123 includes the piezoelectric portion 123a disposed in the central portion S and the bent portion 123b disposed in the extension portion E.

The piezoelectric portion 123a is directly stacked on an upper surface of the first electrode 121. Therefore, the piezoelectric portion 123a is interposed between the first electrode 121 and the second electrode 125 to thereby be formed to be flat together with the first electrode 121 and the second electrode 125.

The bent portion 123b is a region extended outwardly from the piezoelectric portion 123a and positioned in the extension portion E.

The bent portion 123b is disposed on the insertion layer 170, and protrudes depending on a shape of the insertion layer 170. Therefore, the piezoelectric layer 123 is bent at a boundary between the piezoelectric portion 123a and the bent portion 123b, and the bent portion 123b protrudes depending on a thickness and a shape of the insertion layer 170.

The bent portion 123b includes the inclined portion 1231 and an extended portion 1232. The inclined portion 1231 is a portion inclined along an inclined surface L of an insertion layer 170. In addition, the extended portion 1232 is a portion extended outwardly from the inclined portion 1231.

The inclined portion 1231 is formed parallel to the inclined surface L of the insertion layer 170, and an incline angle of the inclined portion 1231 may be the same as an incline angle $\theta$ (see FIG. 4) of the inclined surface L of the insertion layer 170.

The insertion layer 170 is disposed along a surface formed by the membrane layer 150, the first electrode 121, and the etching preventing portion 145. The insertion layer 170 is disposed in the vicinity of the central portion S and supports the bent portion 123b of the piezoelectric layer 123. Therefore, the bent portion 123b of the piezoelectric layer 123 is divided into the inclined portion 1231 and the extended portion 1232 depending on the shape of the insertion layer 170.

The insertion layer 170 is disposed in a region of the resonant part 120 excluding the central portion S. That is, the insertion layer 170 is not disposed in the central portion S. For example, the insertion layer 170 is disposed over the entirety of the region of the resonant part 120 except for the central portion S, or is disposed in a portion of the region of the resonant part 120 excluding the central portion S.

In addition, at least a portion of the insertion layer 170 is disposed between the piezoelectric layer 123 and the first electrode 121.

Referring to FIG. 4, a side surface of the insertion layer 170 disposed adjacent to/along a boundary of the central portion S has a thickness that increases as a distance from the central portion S increases. Therefore, the side surface of the insertion layer 170 disposed adjacent to the central portion S is the inclined surface L having a predetermined incline angle $\theta$.

When the incline angle $\theta$ of the side surface of the insertion layer 170 is smaller than 5°, a thickness of the insertion layer 170 needs to be very small, or an area of the inclined surface L needs to be excessively large in order to manufacture the insertion layer 170 of which the incline angle $\theta$ of the side surface is smaller than 5°, which is substantially difficult to implement.

In addition, when the incline angle $\theta$ of the side surface of the insertion layer 170 is greater than 70°, an incline angle of the inclined portion 1231 of the piezoelectric layer 123 stacked on the insertion layer 170 is greater than 70°. In this case, the piezoelectric layer 123 is excessively bent, such that a crack may be generated in the bent portion 123b of the piezoelectric layer 123.

Therefore, the incline angle $\theta$ of the inclined surface L is in a range of 5° to 70°.

The insertion layer 170 is formed of a dielectric material such as a silicon dioxide ($SiO_2$), an aluminum nitride (AlN), an aluminum oxide ($Al_2O_3$), a silicon nitride (SiN), a magnesium oxide (MgO), a zirconium oxide ($ZrO_2$), a lead zirconate titanate (PZT), a gallium arsenide (GaAs), a hafnium oxide ($HfO_2$), a titanium oxide ($TiO_2$), or a zinc oxide (ZnO), but may be formed of a material different from that of the piezoelectric layer 123. In addition, a region in which the insertion layer 170 is provided may be an empty space, if necessary. This configuration may be implemented by removing the insertion layer 170 after the resonant part 120 is completely formed in a manufacturing process.

The insertion layer 170 may have a thickness that is the same as or similar to that of the first electrode 121. In addition, the insertion layer 170 may have a thickness that is similar to or less than that of the piezoelectric layer 123. For example, the insertion layer 170 is formed to have a thickness of 100 Å or more, and has a thickness less than that of the piezoelectric layer 123. However, the insertion layer 170 is not limited to this example.

The resonant part 120 is spaced apart from the substrate 110 through the cavity C.

The cavity C may be formed by supplying the etching gas (or an etchant) to introduction holes H (see FIGS. 1 and 3) in a process of manufacturing the acoustic resonator 100 to remove a portion of the sacrificial layer 140.

A protecting layer 127 is disposed along a surface of the acoustic resonator 100 to protect the acoustic resonator 100 from the external environment. The protecting layer 127 is disposed along a surface formed by the second electrode 125, the bent portion 123b of the piezoelectric layer 123, and the insertion layer 170.

The protecting layer 127 may be formed of any one of a silicon oxide based insulating material, a silicon nitride based insulating material, an aluminum oxide based insulating material, and an aluminum nitride based insulating material, but is not limited to these examples.

The first electrode 121 and the second electrode 125 are extended outwardly of the resonant part 120, and a first connection electrode 180 and a second connection electrode 190 are disposed on upper surfaces of extended portions of the first electrode 121 and the second electrode 125, respectively.

The first metal layer 180 and the second metal layer 190 may be formed of a material such as gold (Au), a gold-tin (Au—Sn) alloy, copper (Cu), or a copper-tin (Cu—Sn) alloy.

The first metal layer 180 and the second metal layer 190 function as connection wirings electrically connecting the first and second electrodes 121 and 125 of the acoustic resonator 100 to electrodes of another acoustic resonator disposed adjacent to the acoustic resonator 100 or function as external connection terminals. However, the first metal layer 180 and the second metal layer 190 are not limited to these purposes.

Meanwhile, a case in which the insertion layer 170 is disposed below the second metal layer 190 is illustrated in FIG. 2, but the acoustic resonator 100 is not limited thereto. That is, the acoustic resonator 100 may also be implemented in a structure in which the insertion layer 170 is removed below the second metal layer 190, if necessary.

The first metal layer 180 penetrates through the insertion layer 170 and the protecting layer 127 and is bonded to the first electrode 121.

In addition, as illustrated in FIG. 3, the first electrode 121 has an area that is greater than an area of the second electrode 125, and the first metal layer 180 is formed in a circumferential portion of the first electrode 121.

Therefore, the first metal layer 180 is disposed along a circumference of the resonant part 120 to thereby surround the second electrode 125. However, the first metal layer 180 is not limited to this configuration.

As described above, the second electrode 125 is stacked on the piezoelectric portion 123a and the inclined portion 1231 of the piezoelectric layer 123. In addition, the portion 125a (see FIG. 4) of the second electrode 125 disposed on the inclined portion 1231 of the piezoelectric layer 123, that is, the portion of the second electrode 125a disposed in the extension portion E, is not disposed over the entirety of an inclined surface of the inclined portion 1231, but is disposed on only a portion of the inclined surface of the inclined portion 1231.

Figure 18:
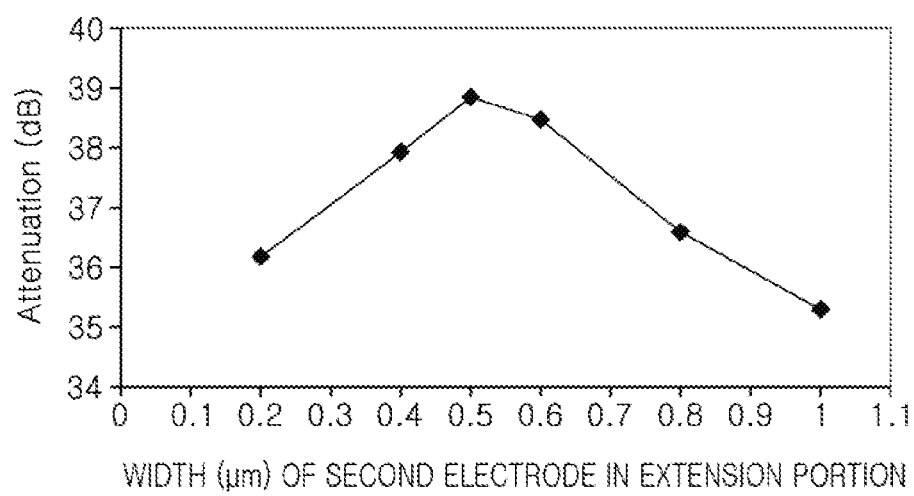
FIG. 18 is a graph illustrating attenuation of an acoustic resonator, according to an embodiment, depending on a second electrode structure of the acoustic resonator.

FIG. 18 is a graph illustrating attenuation of the acoustic resonator 100 depending on a structure of the second electrode 125.

FIG. 18 is a graph illustrating a result obtained by measuring attenuation of the acoustic resonator 100, as illustrated in FIGS. 2 and 3, in which a thickness of the insertion layer 170 is 3000 Å, an incline angle θ of the inclined surface L of the insertion layer 170 is 20°, and a length $l_s$ (or a width) of the inclined surface L is 0.87 μm while changing a size of the portion 125a of the second electrode 125 disposed in the extension portion E. In addition, Table 1 is a table in which values of the graph illustrated in FIG. 18 are arranged.

TABLE 1

| Width (μm) of Second Electrode in Extension Portion | Attenuation (dB) | Width (μm) of Second Electrode in Extension Portion/Length (μm) of Inclined Surface |
|---|---|---|
| 0.2 | 36.201 | 0.23 |
| 0.4 | 37.969 | 0.46 |
| 0.5 | 38.868 | 0.575 |
| 0.6 | 38.497 | 0.69 |
| 0.8 | 36.64 | 0.92 |
| 1 | 35.33 | 1.149 |

※ Length of Inclined Surface: 0.87 μm

The inclined surface of the piezoelectric layer 123 may be formed in the same shape as that of the inclined surface of the insertion layer 170 along the inclined surface of the insertion layer 170, and a length of the inclined surface of the piezoelectric layer 123 may therefore be considered as being the same as the length $l_s$ of the inclined surface L of the insertion layer.

Referring to FIG. 18 and Table 1, it was measured that attenuation is the smallest when the portion 125a of the second electrode 125 is stacked at a width of 0.5 μm on the inclined surface of the piezoelectric layer 123 in the acoustic resonator 100 in which the length $l_s$ of the inclined surface of the piezoelectric layer 123 in the extension portion E is 0.87 μm. In addition, it was measured that attenuation is deteriorated due to an increase in the attenuation when the width of the portion 125a of the second electrode 125 in the extension portion E becomes greater or less than the above-mentioned width.

It can be appreciated from Table 1 that the attenuation is maintained at 37 dB or more when a ratio $(W_e/l_s)$ between the width $W_e$ of the second electrode 125 and the length $l_s$ of the inclined surface in the extension portion E is 0.46 to 0.69.

Therefore, in order to provide the attenuation, in the acoustic resonator 100, the ratio $(W_e/l_s)$ between the width $W_e$ of the second electrode 125 and the length $l_s$ of the inclined surface in the extension portion E is limited to being in a range of 0.46 to 0.69. However, all the components according to this disclosure are not limited to the above-mentioned range, and the abovementioned range may be changed depending on a change in the incline angle θ or the thickness of the insertion layer 170.

Next, a method of manufacturing an acoustic resonator according to the present exemplary embodiment will be described.

FIGS. 5 through 8 are views illustrating a method of manufacturing the acoustic resonator 100, according to an embodiment.

Figure 5:
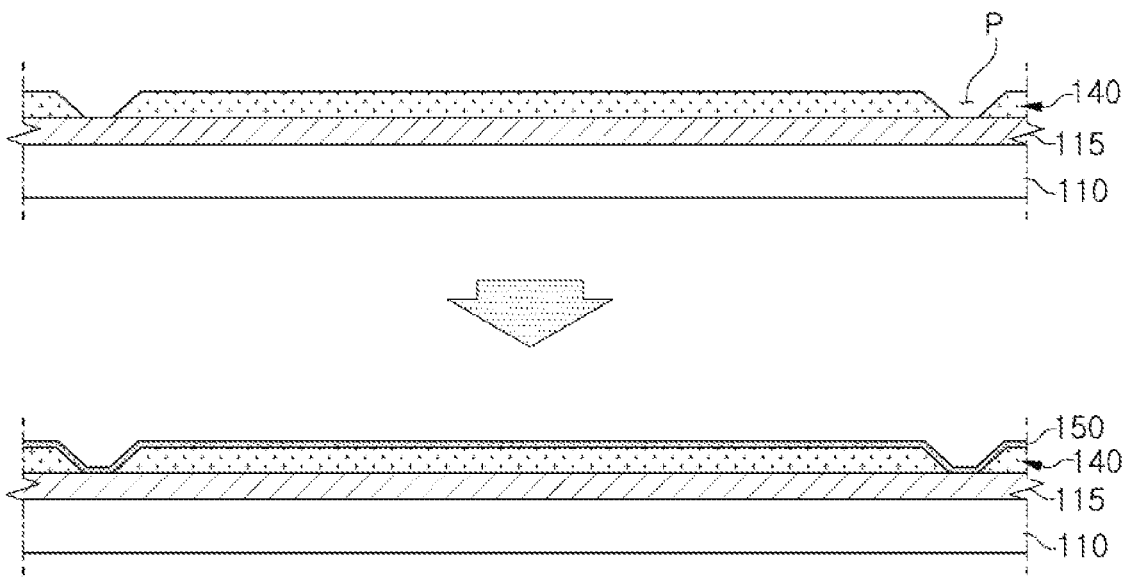
FIGS. 5 through 8 are views illustrating a method of manufacturing an acoustic resonator, according to an embodiment.

First, referring to FIG. 5, in the method of manufacturing the acoustic resonator, the insulating layer 115 and the sacrificial layer 140 are formed on the substrate 110, and a pattern P penetrating through the sacrificial layer 140 is formed. Therefore, the insulating layer 115 is externally exposed through the pattern P.

The insulating layer 115 may be formed of a magnesium oxide (MgO), a zirconium oxide ($ZrO_2$), an aluminum nitride (AlN), a lead zirconate titanate (PZT), a gallium arsenide (GaAs), a hafnium oxide ($HfO_2$), an aluminum oxide ($Al_2O_3$), a titanium oxide ($TiO_2$), a zinc oxide (ZnO), a silicon nitride (SiN), or a silicon dioxide ($SiO_2$), but is not limited to these examples.

The pattern P has a trapezoidal cross section of which an upper surface has a width greater than a width of a lower surface.

The sacrificial layer 140 is partially removed through a subsequent etching process to form the cavity C (See FIG. 2). Therefore, the sacrificial layer 140 may be formed of a material, such as polysilicon or polymer, that may be easily etched. However, a material of the sacrificial layer 140 is not limited to the foregoing examples.

Then, the membrane layer 150 is formed on the sacrificial layer 140. The membrane layer 150 may be formed at a predetermined thickness on a surface of the sacrificial layer 140. The membrane layer 150 may have a thickness that is less than a thickness of the sacrificial layer 140.

The membrane layer 150 may include either one or both of a silicon dioxide ($SiO_2$) and a silicon nitride ($Si_3N_4$). In addition, the membrane layer 150 is a dielectric layer containing any one or any combination of any two or more of a magnesium oxide (MgO), a zirconium oxide ($ZrO_2$), an aluminum nitride (AlN), a lead zirconate titanate (PZT), a gallium arsenide (GaAs), a hafnium oxide ($HfO_2$), an aluminum oxide ($Al_2O_3$), a titanium oxide ($TiO_2$), and a zinc oxide (ZnO), or may be a metal layer containing any one or any combination of any two or more of aluminum (Al), nickel (Ni), chromium (Cr), platinum (Pt), gallium (Ga), and hafnium (Hf). However, the membrane layer 150 is not limited to the foregoing examples.

Although not illustrated, the seed layer is formed on the membrane layer 150.

The seed layer is disposed between the membrane layer 150 and the first electrode 121 to be described below. The seed layer may be formed of an aluminum nitride (AlN), but is not limited t. That is, the seed layer may be formed of a dielectric material or a metal having an HCP structure. For example, when the seed layer is formed of the metal, the seed layer is formed of titanium (Ti).

Figure 6:
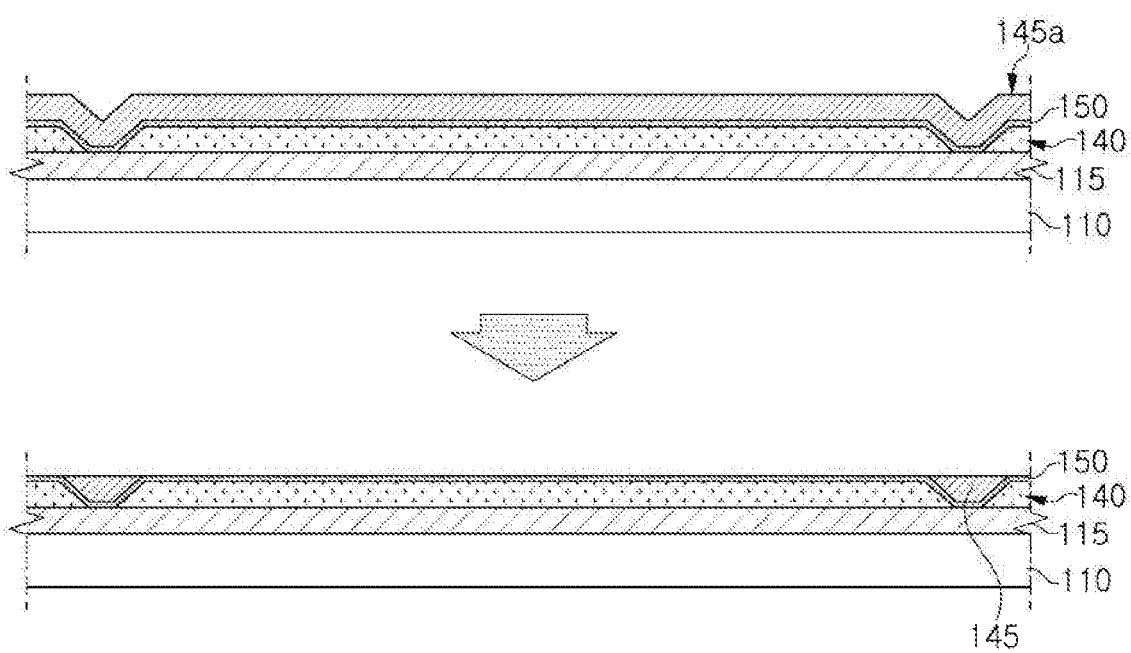

Then, as illustrated in FIG. 6, an etching preventing layer 145a is formed on the membrane layer 150. The etching preventing layer 145a is also filled in the pattern P.

The etching preventing layer 145a is formed at a thickness enough to completely fill the pattern P. Therefore, the etching preventing layer 145a is thicker than the sacrificial layer 140.

The etching preventing layer 145a and the insulating layer 115 may be formed of the same material, but are not limited thereto.

Then, a portion of the etching preventing layer 145a is removed so that the membrane layer 150 is externally exposed. In this case, a portion of the etching preventing layer 145a filled in the pattern P remains and forms the etching preventing portion 145.

Figure 7:
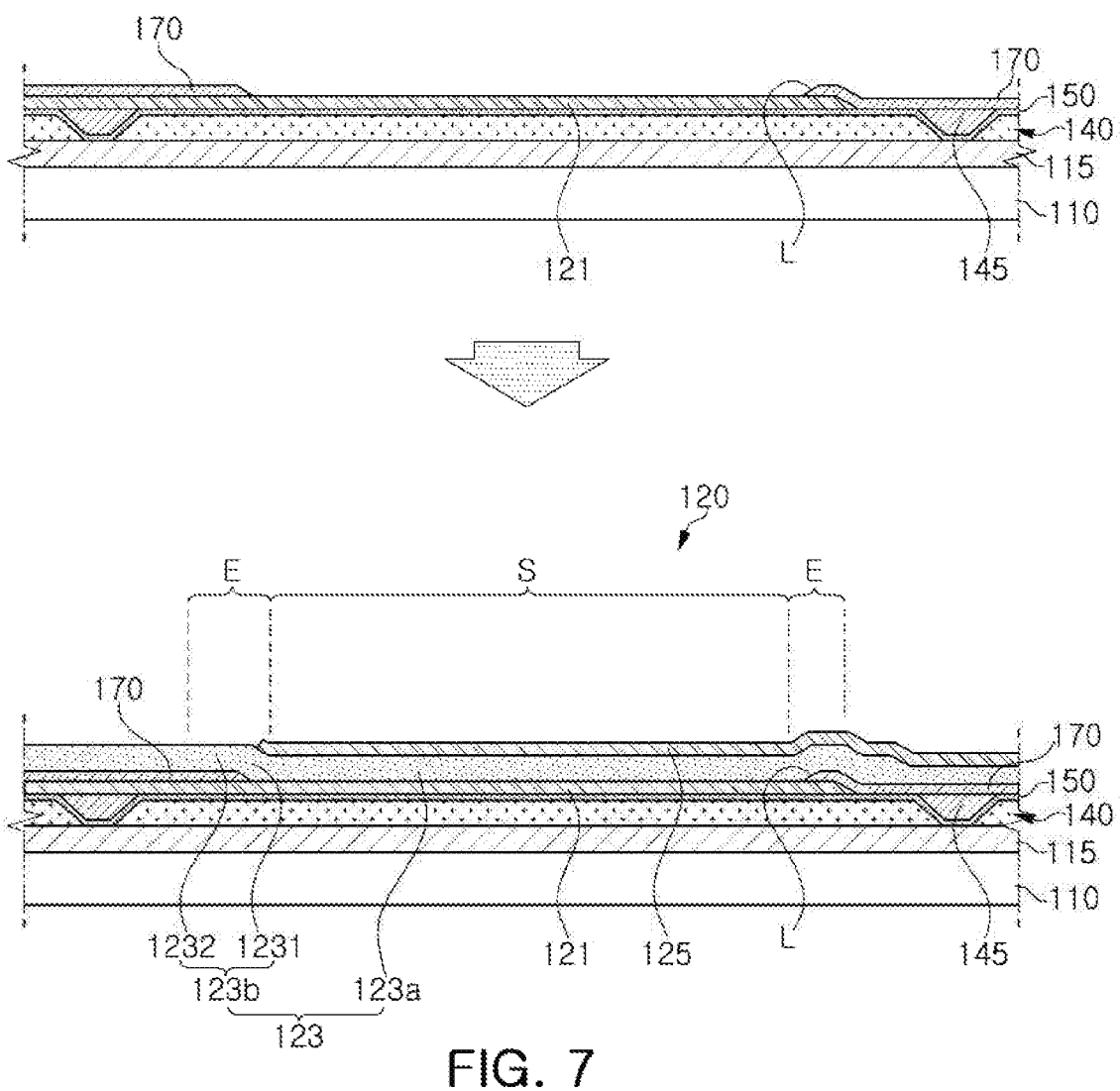

Then, as illustrated in FIG. 7, the first electrode layer 121 is formed on an upper surface of the membrane layer 150.

The first electrode 121 is formed of an electric conductor, for example, any one or any combination of any two or more of gold, molybdenum, ruthenium, iridium, aluminum, platinum, titanium, tungsten, palladium, tantalum, chromium, and nickel, but is not limited to these examples.

The first electrode 121 is formed above a region in which the cavity C (see FIG. 3) is to be formed.

The first electrode 121 is formed by forming an electric conductor layer covering the entirety of the membrane layer 150 and then removing an unnecessary portion of the electric conductor layer.

Then, the insertion layer 170 is formed. The insertion layer 170 is formed on the first electrode 121, and is extended onto the membrane layer 150, if necessary.

The insertion layer 170 is formed to cover the entirety of a surface formed by the membrane layer 150, the first electrode 121, and the etching preventing portion 145 and is then completed by removal of a portion disposed in a region corresponding to the central portion S.

Therefore, a central portion of the first electrode 121 corresponding to the central portion S is exposed externally of the insertion layer 170. In addition, the insertion layer 170 is formed along a circumference of the first electrode 121 to cover a portion of the first electrode 121. Therefore, an edge portion of the first electrode 121 disposed in the extension portion E is disposed below the insertion layer 170.

The side surface of the insertion layer 170 disposed adjacent to the central portion S is the inclined surface L. The insertion layer 170 has a thickness that becomes small toward the central portion S, and a lower surface of the insertion layer 170 is further extended toward the central portion S as compared to an upper surface of the insertion layer 170. The incline angle of the inclined surface L of the insertion layer 170 is in the range of 5° to 70° as described above.

The insertion layer 170 is formed of a dielectric material such as a silicon dioxide ($SiO_2$), an aluminum nitride (AlN), an aluminum oxide ($Al_2O_3$), a silicon nitride (SiN), a magnesium oxide (MgO), a zirconium oxide ($ZrO_2$), a lead zirconate titanate (PZT), a gallium arsenide (GaAs), a hafnium oxide ($HfO_2$), a titanium oxide ($TiO_2$), or a zinc oxide (ZnO), but may be formed of a material different from that of the piezoelectric layer 123.

Then, the piezoelectric layer 123 is formed on the first electrode 121 and the insertion layer 170.

The piezoelectric layer 123 may be formed of an aluminum nitride (AlN). However, a material of the piezoelectric layer 123 is not limited to AlN. That is, a zinc oxide (ZnO), a doped aluminum nitride, a lead zirconate titanate, or quartz may also be used as the material of the piezoelectric layer 123. In addition, the doped aluminum nitride may further include a rare earth metal or a transition metal. As an example, the rare earth metal includes any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), niobium (Nb), and magnesium (Mg).

In addition, the piezoelectric layer 123 may be formed of a material different from that of the insertion layer 170.

The piezoelectric layer 123 is formed by forming a piezoelectric material over the entirety of a surface formed by the first electrode 121 and the insertion layer 170 and then partially removing an unnecessary portion of the piezoelectric material. The piezoelectric layer 123 is completed by removing the unnecessary portion of the piezoelectric material after the second electrode 125 is formed. However, the piezoelectric layer 123 is not limited to being formed in the manner described above, and may also be completed before the second electrode 125 is formed.

The piezoelectric layer 123 covers the first electrode 121 and a portion of the insertion layer 170. Therefore, the piezoelectric layer 123 is formed depending on a shape of a surface formed by the first electrode 121 and the insertion layer 170.

As described above, only the portion of the first electrode 121 corresponding to the central portion S is exposed externally of the insertion layer 170. Therefore, the portion of the piezoelectric layer 123 formed on the first electrode 121 is positioned in the central portion S. In addition, the bent portion 123b formed on the insertion layer 170 is positioned in the extension portion E.

Then, the second electrode 125 is formed on the piezoelectric layer 123. The second electrode 125 is formed of an electric conductor, for example, any one or any combination of any two or more of gold, molybdenum, ruthenium, iridium, aluminum, platinum, titanium, tungsten, palladium, tantalum, chromium, and nickel, but is not limited to these examples.

The second electrode 125 is formed on the piezoelectric portion 123a of the piezoelectric layer 123. As described above, the piezoelectric portion 123a of the piezoelectric layer 123 is positioned in the central portion S. Therefore, the portion of the second electrode 125 disposed on the piezoelectric layer 123 is also disposed in the central portion S.

In addition, the second electrode 125 is formed on the inclined portion 1231 of the piezoelectric layer 123. Therefore, as described above, the second electrode 125 is disposed throughout the entirety of the central portion S, and is partially disposed in the extension portion E.

Figure 8:
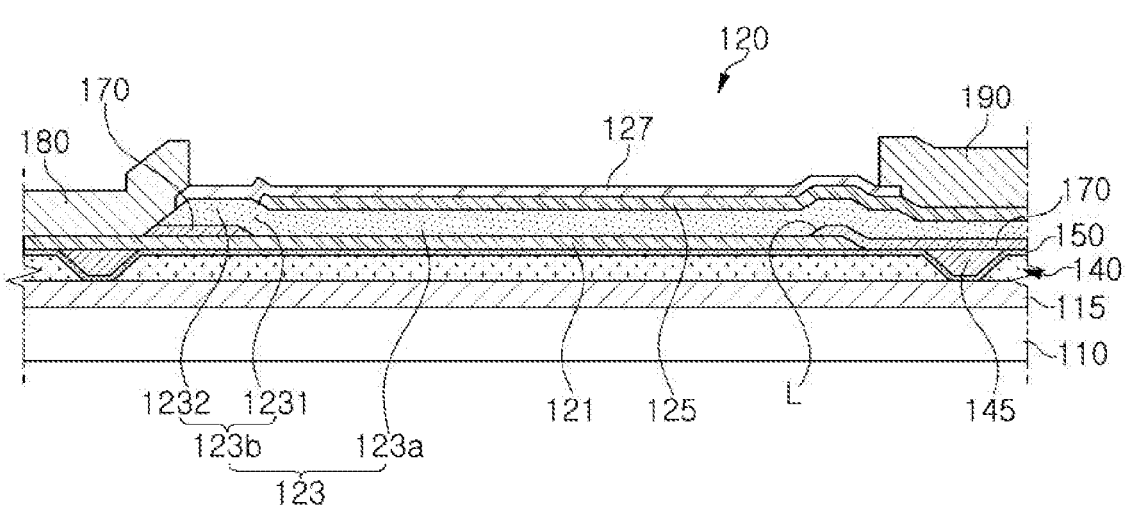

Then, as illustrated in FIG. 8, the protecting layer 127 is formed.

The protecting layer 127 is formed along a surface formed by the second electrode 125 and the piezoelectric layer 123. In addition, although not illustrated, the protecting layer 127 is formed on a portion of the insertion layer 170 that is externally exposed.

The protecting layer 127 may be formed of any one of a silicon oxide based insulating material, a silicon nitride based insulating material, and an aluminum nitride based insulating material, but is not limited to these materials.

Then, the protecting layer 127 and the piezoelectric layer 123 are partially removed to partially expose the first electrode 121 and the second electrode 125, and the first metal layer 180 and the second metal layer 190 are formed on the exposed portions of the first electrode 121 and the second electrode 125, respectively.

The first metal layer 180 and the second metal layer 190 may be formed of a material such as gold (Au), a gold-tin (Au—Sn) alloy, copper (Cu), or a copper-tin (Cu—Sn) alloy, and are deposited on the first electrode 121 and the second electrode 125, respectively, but are not limited to this example.

Then, the cavity C is formed. The cavity C is formed by removing a portion of the sacrificial layer 140 positioned in the etching preventing portion 145. As a result, the acoustic resonator 100 illustrated in FIGS. 2 and 3 is completed. In this process, the sacrificial layer 140 may be removed by an etching operation.

When the sacrificial layer 140 is formed of a material such as polysilicon or polymer, the sacrificial layer 140 is removed by a dry etching method using a halide based etching gas (for example, $XeF_2$) such as fluorine (F) or chlorine (Cl).

In the acoustic resonator 100, the extension portion E of the resonant part 120 may have a thickness that is greater than a thickness of the central portion S, due to the insertion layer 170, to suppress external leakage of vibrations generated in the central portion S, thereby resulting in an increase in a quality (Q) factor of the acoustic resonator 100.

In addition, the second electrode 125 is partially disposed in the extension portion E to provide significantly improved attenuation.

The acoustic resonator 100 is not limited to the embodiment described above, and may be modified in various ways.

Figure 9:
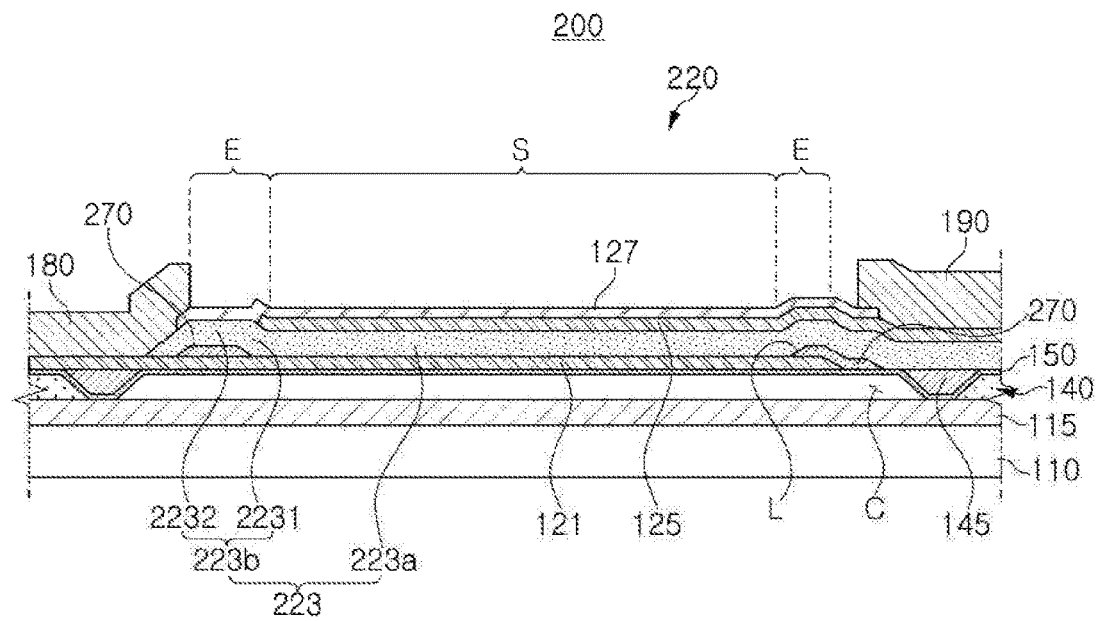
FIGS. 9 and 10 are schematic cross-sectional views illustrating an acoustic resonator, according to another embodiment.
Figure 10:
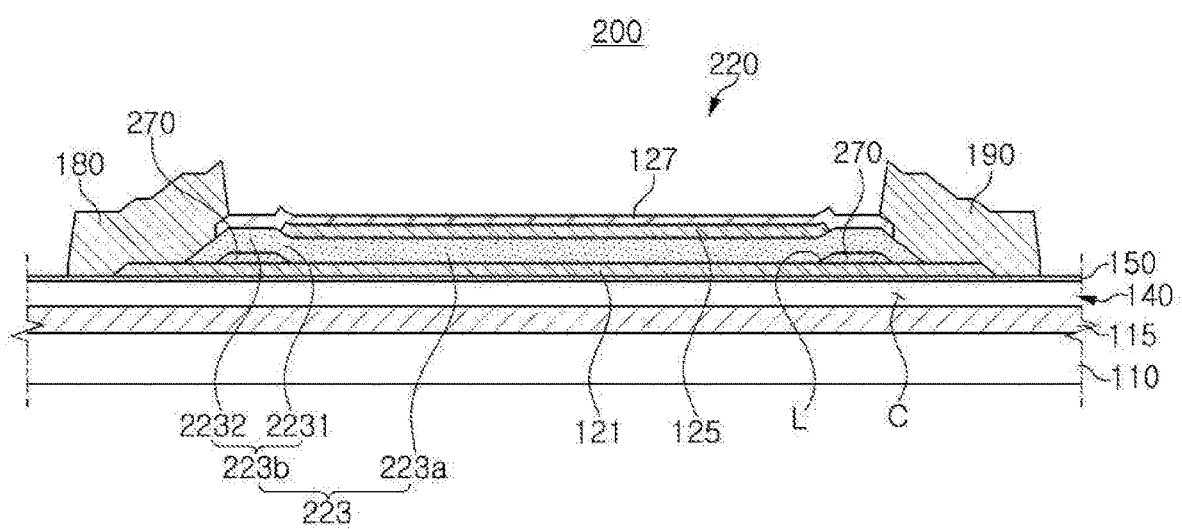

FIGS. 9 and 10 are schematic cross-sectional views illustrating an acoustic resonator 200, according to another embodiment. FIG. 9 is a cross-sectional view corresponding to line I-I' of FIG. 1, and FIG. 10 is a cross-sectional view corresponding to line II-II' of FIG. 1.

Referring to FIGS. 9 and 10, in a resonant part 220 of the acoustic resonator 200, only a portion of an insertion layer 270 supporting a piezoelectric layer 223 remains, and the other portions of the insertion layer 270 are removed. Therefore, the insertion layer 270 is embedded between the piezoelectric layer 223 and the first electrode 121.

The piezoelectric layer 223 has a different shape than the piezoelectric layer 123 of the acoustic resonator 100 in FIGS. 2 to 4 due to the configuration of the insertion layer 270. The piezoelectric layer 223 includes a piezoelectric portion 223a, and a bent portion 223b including an inclined portion 2231 and an extended portion 2232.

When the acoustic resonator 200 is configured as described above, the insertion layer 270 is disposed not to be in contact with the first metal layer 180 or the etching preventing portion 145. In addition, the insertion layer 270 is not be disposed outside the resonant part 120, and is disposed in a region above the cavity C. However, a region in which the insertion layer 270 is disposed is not limited to only regions illustrated in FIGS. 9 and 10, and may be extended to various positions, if necessary.

Figure 11:
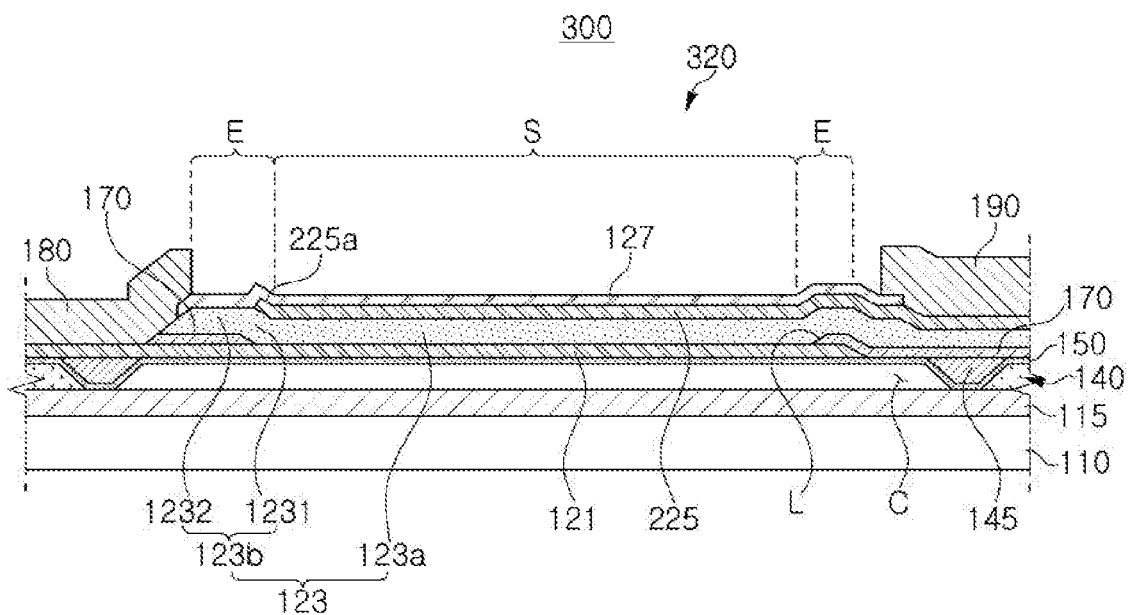
FIGS. 11 through 13 are schematic cross-sectional views illustrating acoustic resonators, according to other embodiments.
Figure 12:
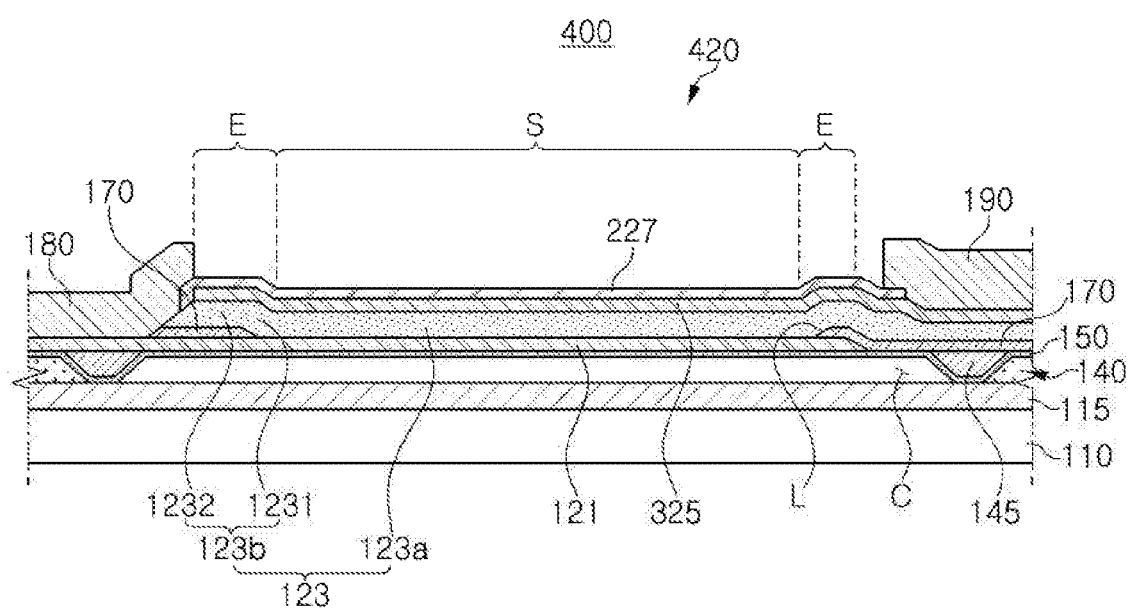
Figure 13:
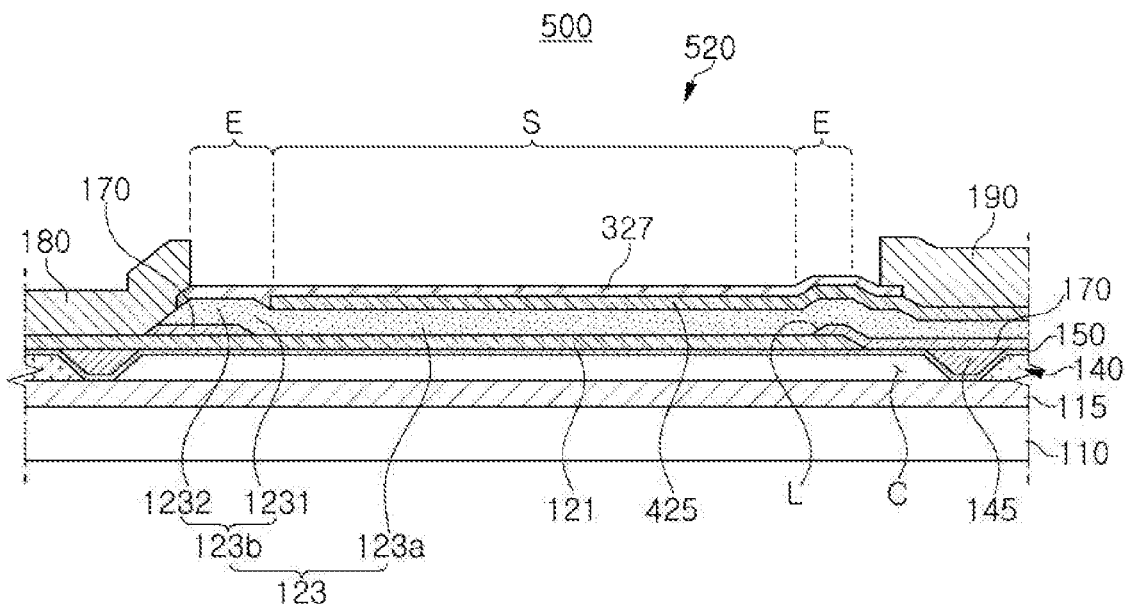

FIGS. 11 through 13 are schematic cross-sectional views illustrating acoustic resonators 300, 400, and 500, according to other embodiments.

First, referring to FIG. 11, in a resonant part 320 of the acoustic resonator 300, a portion 225a of a second electrode 225 disposed in the extension portion E is disposed over the entirety of the inclined surface of the inclined portion 1231 of the piezoelectric layer 123.

In addition, referring to FIG. 12, in a resonant part 420 of the acoustic resonator 400, a second electrode 325 is disposed over the entirety of an upper surface of the piezoelectric layer 123. Therefore, the second electrode 325 is formed on the extended portion 1232 of the piezoelectric layer 123 as well as on the inclined portion 1231 of the piezoelectric layer 123. Additionally, a protecting layer 227 is disposed along a surface formed by the second electrode 325 and the bent portion 123b of the piezoelectric layer 123.

In addition, referring to FIG. 13, in a resonant part 520 of the acoustic resonator 500, a second electrode 425 is formed on only an upper surface of the piezoelectric portion 123a of the piezoelectric layer 123, and is not formed on the bent portion 123b of the piezoelectric layer 123. Additionally, a protecting layer 327 is disposed along a surface formed by the second electrode 425 and the bent portion 123b of the piezoelectric layer 123.

As described above, in the acoustic resonators 200, 300, 400, and 500, a structure of the extension portion E may be modified in various ways, if necessary.

Figure 14:
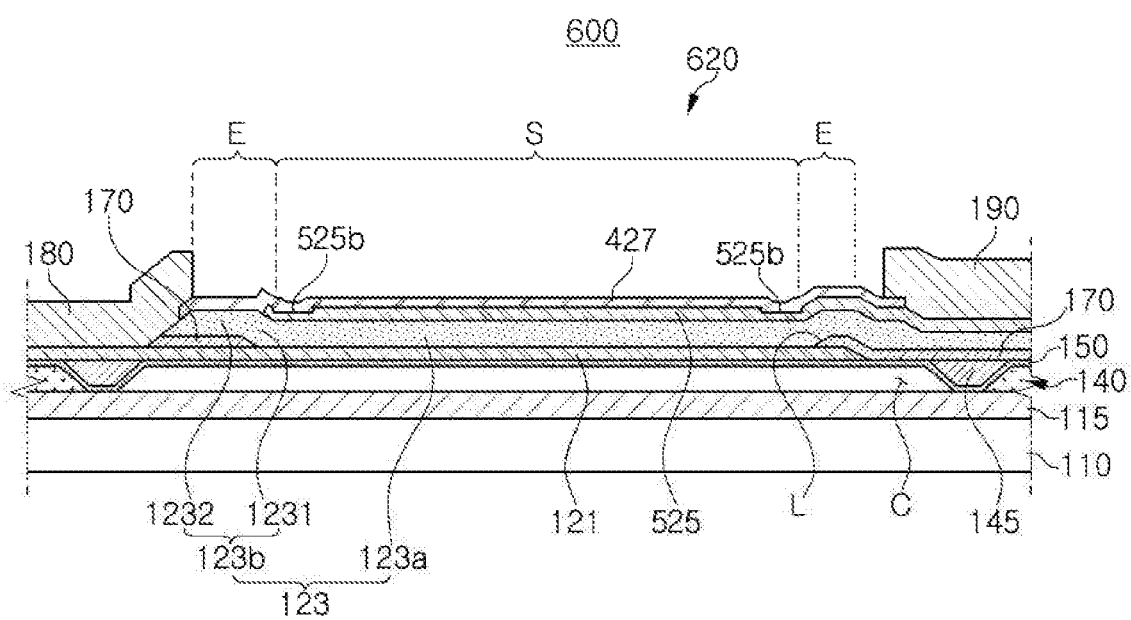
FIG. 14 is a schematic cross-sectional view illustrating an acoustic resonator, according to another embodiment.

FIG. 14 is a schematic cross-sectional view illustrating an acoustic resonator 600, according to another embodiment.

Referring to FIG. 14, in a resonant part 620 of the acoustic resonator 600, at least one trench 525b is provided in an upper surface of a second electrode 525. The trench 525b is may be formed in the second electrode 525 disposed in the central portion S, and may have a groove having a form reducing a thickness of the second electrode 125. In addition, the trench 525b is formed along a boundary of the central portion S, and is disposed adjacent to an edge of the central portion S.

The trench 525b is formed in a continuous ring shape or is formed in a structure in which a partial region thereof is disconnected, but is not limited to such an example. That is, the trench 525b is a groove having partial or discontinuous arc shapes.

In addition, the trench 525b is a groove of which a width is greater than a depth.

Additionally, a protecting layer 427 is disposed along a surface formed by the second electrode 525 and the bent portion 123b of the piezoelectric layer 123.

Figure 15:
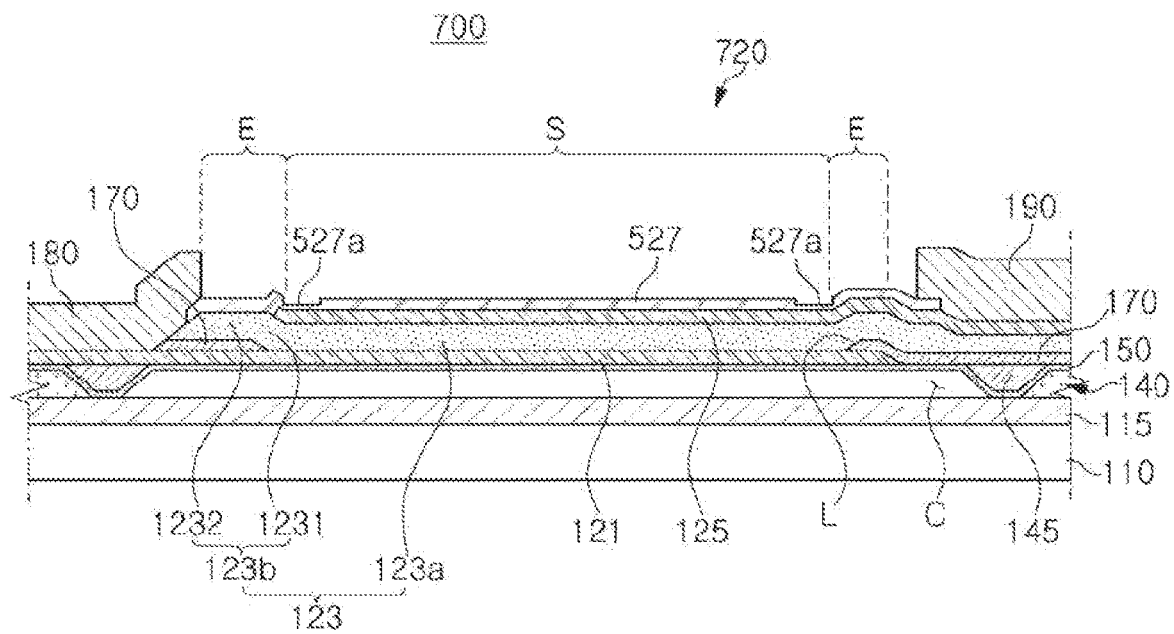
FIG. 15 is a schematic cross-sectional view illustrating an acoustic resonator, according to another embodiment.

FIG. 15 is a schematic cross-sectional view illustrating an acoustic resonator 700, according to an embodiment that is a modified example of the acoustic resonator 600 illustrated in FIG. 14.

Referring to FIG. 15, in a resonant part 720 of the acoustic resonator 700, a trench 527a is formed in a protecting layer 527. The trench 527a is formed in a portion of the protecting layer 527 disposed in the central portion S, and is a groove having a form reducing a thickness of the protecting layer 527. In addition, the trench 527a is formed along a boundary of the central portion S, and is disposed adjacent to an edge of the central portion S.

Like the embodiment of FIG. 14 described above, the trench 527a is formed in a continuous ring shape or is formed in a structure in which a partial region thereof is disconnected. In addition, the trench 527a is a groove of which a width is greater than a depth. However, the trench 527a is not limited to the described example.

Figure 16:
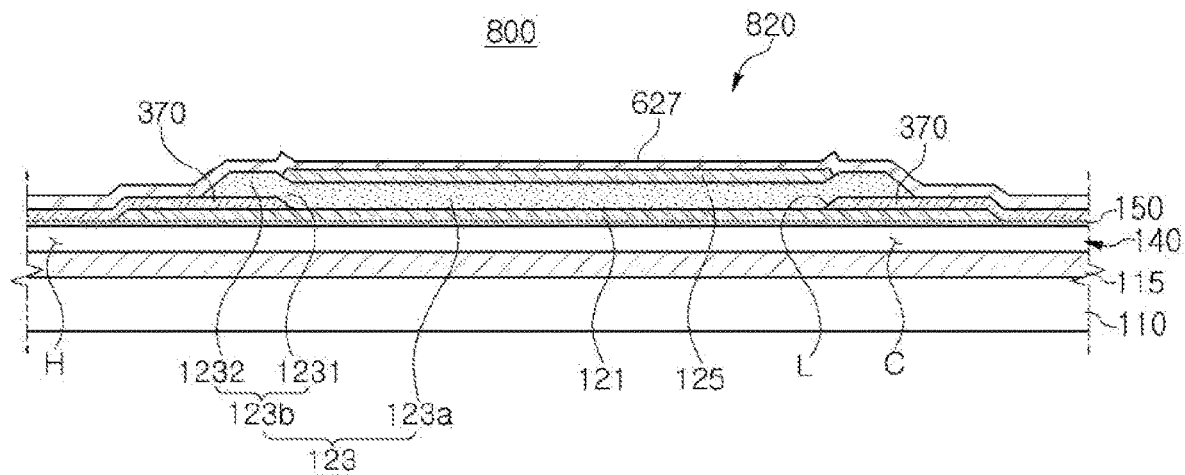
FIG. 16 is a schematic cross-sectional view illustrating an acoustic resonator, according to another embodiment.

FIG. 16 is a schematic cross-sectional view illustrating an acoustic resonator 800, according to another embodiment, and illustrates a cross section corresponding to line I-I' of FIG. 2.

Referring to FIG. 16, the acoustic resonator 800 is similar to the acoustic resonator 100, except that the first metal layer 180 (see FIG. 3) is not disposed at the circumference of a resonant part 820 in the acoustic resonator 800.

In the acoustic resonator 800, the first metal layer 180 is formed on only a connection wiring connected to an electrode of another acoustic resonator, and is not formed in the vicinity of a resonant part 820.

Therefore, an insertion layer 370 and a protecting layer 627 stacked on the insertion layer 370 are disposed over the entirety of the surrounding region of the resonant part 820. However, the insertion layer 370 and the protecting layer 627 are not limited to such a configuration, and may also be partially disposed in the surrounding region of the resonant part 820, if necessary.

Figure 17:
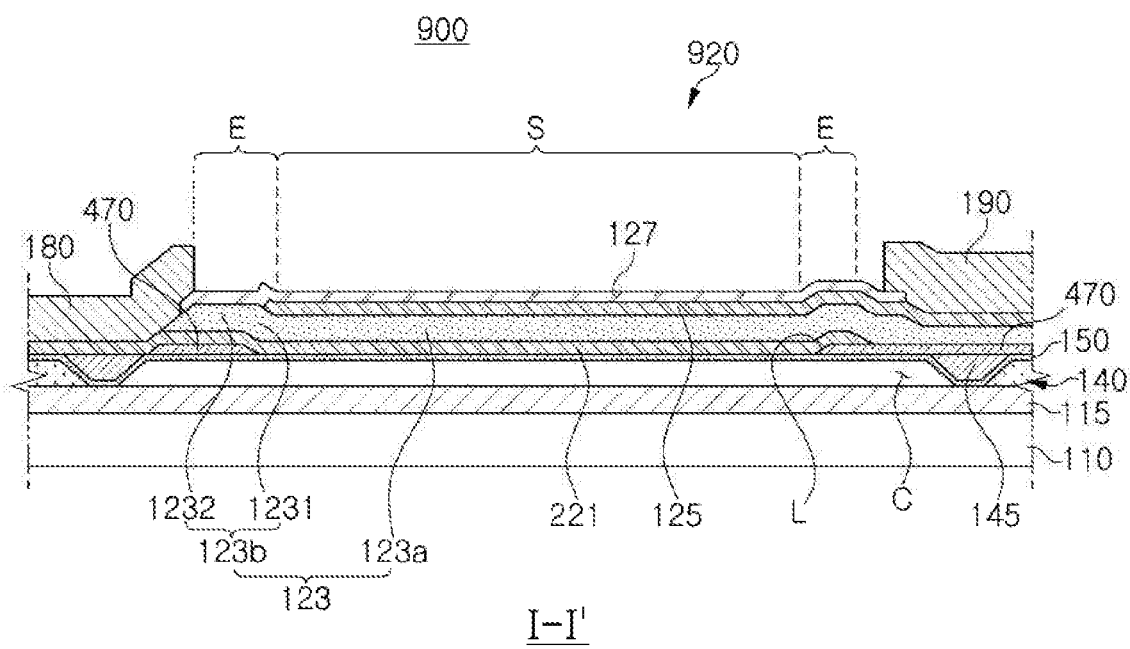
FIG. 17 is a schematic cross-sectional view illustrating an acoustic resonator, according to another embodiment.

FIG. 17 is a schematic cross-sectional view illustrating an acoustic resonator 900, according to another embodiment.

Referring to FIG. 17, the acoustic resonator 900 is similar to the acoustic resonator 100 illustrated in FIGS. 2 and 3, except that, in a resonant part 920 of the acoustic resonator 900, at least a portion of an insertion layer 470 is inserted between the membrane layer 150 and a first electrode 221.

In the acoustic resonator 900, the insertion layer 470 is formed on the membrane layer 150 before the first electrode 221 is formed in a manufacturing process, and the first electrode 221 may be formed on the insertion layer 470 to cover a portion of the insertion layer 470. Therefore, in the acoustic resonator 900, inclined surfaces are formed on both of the first electrode 221 and the piezoelectric layer 123.

In the acoustic resonators according to the disclosed embodiments, inclined portions are formed on the piezoelectric layer and the second electrode in a region of the extension portion to suppress external leakage of transversal vibrations, thus resulting in improvement of performance of the acoustic resonator.

As set forth above, in the acoustic resonators according to the disclosed embodiments, inclined regions are formed in the piezoelectric layer and the second electrode by the insertion layer disposed below the piezoelectric layer to suppress external leakage of transversal vibrations, thereby resulting in improvement of performance of the acoustic resonator.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator, comprising:
 a resonant part comprising:
  a central portion;
  an extension portion extended outwardly of the central portion;
  a first electrode, a piezoelectric layer, and a second electrode stacked on a substrate, in the central portion; and
  an insertion layer disposed below the piezoelectric layer in the extension portion, wherein the piezoelectric layer comprises
  a piezoelectric portion disposed in the central portion, and
  a bent portion disposed in the extension portion and extended from the piezoelectric portion at an incline depending on a shape of the insertion layer, and
 wherein the insertion layer is disposed over the resonant part to surround and expose the central portion, and
 wherein an end of the second electrode is disposed on the incline.

2. The acoustic resonator of claim 1, wherein
 the insertion layer comprises an inclined surface so that the insertion layer comprises a thickness that increases as a distance from the central portion increases, and
 the bent portion comprises an inclined portion disposed on the inclined surface of the insertion layer.

3. The acoustic resonator of claim 1, wherein a portion of the insertion layer is disposed below the first electrode or between the first electrode and the piezoelectric layer.

4. The acoustic resonator of claim 2, wherein a portion of the second electrode is disposed in the extension portion.

5. The acoustic resonator of claim 4, wherein the portion of second electrode disposed in the extension portion is formed on an inclined surface of the inclined portion, and comprises an area that is smaller than an area of the inclined surface of the inclined portion.

6. The acoustic resonator of claim 4, wherein the portion of the second electrode disposed in the extension portion is formed over an entirety of an inclined surface of the inclined portion.

7. The acoustic resonator of claim 4, wherein
the bent portion of the piezoelectric layer comprises an extended portion extended outwardly from the inclined portion, and
the second electrode is disposed on the inclined portion and the extended portion.

8. The acoustic resonator of claim 1, further comprising a cavity disposed between the substrate and the central portion.

9. The acoustic resonator of claim 8, further comprising an etching preventing portion disposed along a boundary of the cavity and defining a horizontal area of the cavity.

10. The acoustic resonator of claim 1, wherein the second electrode comprises a trench formed along a boundary of the central portion.

11. The acoustic resonator of claim 1, further comprising:
a protecting layer disposed on the second electrode,
wherein the protecting layer comprises a trench formed along a boundary of the central portion.

12. The acoustic resonator of claim 1, wherein the insertion layer is formed of a material that is different from a material of the piezoelectric layer.

13. The acoustic resonator of claim 1, wherein the insertion layer is formed of a dielectric material.

14. A method to manufacture an acoustic resonator, comprising:
forming a resonant part comprising a central portion and an extension portion extended outwardly of the central portion,
wherein the forming the resonant part comprises:
forming a first electrode on a substrate;
forming an insertion layer on the first electrode and the substrate;
forming a piezoelectric layer comprising a piezoelectric portion stacked on the first electrode and a bent portion extended at an incline from a boundary of the piezoelectric portion; and
forming a second electrode on the piezoelectric layer,
wherein the insertion layer is disposed over the resonant part to surround and expose the central portion, and
wherein an end of the second electrode is disposed on the incline.

15. The method of claim 14, wherein the bent portion comprises an inclined surface comprising a configuration depending on a shape of the insertion layer.

16. The method of claim 15, the forming of the second electrode on the piezoelectric layer comprises forming the second electrode over an entirety of an upper surface of the piezoelectric portion and on a portion of the inclined surface of the bent portion.

17. An acoustic resonator, comprising:
a resonant part comprising:
a central portion;
an extension portion extended outwardly of the central portion;
a first electrode, a piezoelectric layer, and a second electrode stacked on a substrate, in the central portion; and
an insertion layer disposed below the piezoelectric layer in the extension portion,
wherein a portion of the piezoelectric layer disposed in the extension portion comprises an inclined portion caused by the insertion layer,
wherein the insertion layer is disposed over the resonant part to surround and expose the central portion, and
wherein an end of the second electrode is disposed on the incline.

18. The acoustic resonator of claim 17, wherein the inclined portion is disposed on an inclined surface of the insertion layer.

19. The acoustic resonator of claim 18, wherein the inclined portion and the inclined surface are inclined at a same angle.

20. The acoustic resonator of claim 18, wherein the inclined surface is inclined at an angle of 5° to 70°.

21. The acoustic resonator of claim 17, wherein the central portion and the extension portion are disposed in a resonant part of the acoustic resonator.

22. An acoustic resonator, comprising:
a resonant part comprising:
a central portion;
an extension portion extended outwardly of the central portion;
a first electrode, a piezoelectric layer, and a second electrode stacked on a substrate, in the central portion; and
an insertion layer disposed an insertion layer disposed on the first electrode in the extension portion,
wherein the piezoelectric layer comprises
a piezoelectric portion disposed in the central portion, and
a bent portion disposed in the extension portion and extended from the piezoelectric portion at an incline depending on a shape of the insertion layer,
wherein the insertion layer is disposed at the extension portion disposed at both ends of the central portion in a cross-sectional surface where the resonant part is cut across the center portion, and
wherein an end of the second electrode is disposed on the incline.

* * * * *